US006429740B1

United States Patent
Nguyen et al.

(10) Patent No.: US 6,429,740 B1
(45) Date of Patent: Aug. 6, 2002

(54) HIGH POWER AMPLIFIER LINEARIZATION METHOD USING EXTENDED SALEH MODEL PREDISTORTION

(75) Inventors: Tien M. Nguyen, Fullerton; James Yoh, Palos Verdes Peninsula; Andrew S. Parker; Diana M. Johnson, both of Redondo Beach, all of CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 09/533,571

(22) Filed: Mar. 23, 2000

(51) Int. Cl.[7] .................................. H03F 1/26
(52) U.S. Cl. ...................................... 330/149
(58) Field of Search .................... 330/149; 375/296, 375/297; 499/63

(56) References Cited

U.S. PATENT DOCUMENTS

| | | | |
|---|---|---|---|
| 5,867,065 A | * | 2/1999 | Leyendecker ............... 330/149 |
| 6,075,411 A | * | 6/2000 | Briffa et al. ................. 330/149 |
| 6,307,435 B1 | * | 10/2001 | Nguyen et al. .............. 330/149 |

OTHER PUBLICATIONS

Ade M. Saleh, "Frequency–Independent and Frequency–Dependent Nonlinear Models of TWT Amplifiers," IEEE Transactions on Communications, 11th ed., IEEE vol. Com (No. 11), pp. 1715–1720, (November 20, 1981).
Andrea, Lottici, Reggiannini, "RF Power Amplifier Linearization Through Amplitude and Phase Predistortion," IEEE Transactions on Communications, IEEE, vol. 44 (No. 11), pp. 1477–1484, (November 20, 1996).

* cited by examiner

Primary Examiner—Steven J. Mottola
(74) Attorney, Agent, or Firm—Derrick Michael Reid

(57) ABSTRACT

A predistortion method uses an extended Saleh model for linearizing the output of nonlinear high power amplifiers having inherent amplitude modulation to amplitude modulation distortion, and inherent amplitude modulation to phase modulation distortion, during conversions of an input signal to an output signal. A complex baseband linearizer provides predistortion at baseband for reducing spectral regrowth and improves bit error performance. The predistortion effects are matched to the amplifier distortions to cancel out the distortions to provide linearized conversions. The extended Saleh model provides a general solution using selected coefficients matched to distortion effects of a particular amplifier.

6 Claims, 5 Drawing Sheets

BASEBAND PREDISTORTING LINEARIZER

BASEBAND PREDISTORTING LINEARIZER

INPUT AND OUTPUT PHASE CONVERSION

INPUT POWER AND OUTPUT PHASE CONVERSION

HIGH POWER AMPLIFIER LINEARIZATION METHOD USING EXTENDED SALEH MODEL PREDISTORTION

REFERENCE TO RELATED APPLICATION

The present application is related to applicant's copending application entitled "High Power Amplifier Linearization Method using Modified Log Model Predistortion" Ser. No. 09/534,105, filed Mar. 23, 2000, by the same inventors, and now U.S. Pat. No. 6,307,435.

STATEMENT OF GOVERNMENT INTEREST

The inventions were made with Government support under contract No. F04701-93-C-0094 by the Department of the Air Force. The Government has certain rights in the invention.

FIELD OF THE INVENTION

The inventions relate to the field of linearizing amplifier predistortion. More particularly, the present inventions relate to high power amplifier predistortion at baseband based on improved Saleh modeling and linear-log modeling.

BACKGROUND OF THE INVENTION

High power amplifiers (HPA) suffer from the effects of amplitude modulation to amplitude modulation distortion (AM-AM), also referred to herein as amplitude distortion, and amplitude modulation to phase modulation distortion (AM-PM) also referred to herein as phase distortion, during conversions caused by the HPA amplifiers, such as solid-state power amplifiers (SSPA) or travelling wave tube amplifiers (TWTA). Amplitude distortion and phase distortion are major concerns to communication systems engineers. These distortions can cause intermodulation (IM) components and spectral regrowth, which are undesirable to system designs. The intermodulation components and the spectral regrowth can cause adjacent channel interference to other communication channels. Furthermore, these distortion effects also cause loss in power transmission. In addition, the effects of AM-AM and AM-PM distortions can also cause the signal distortion that can degrade the bit error rate (BER) performance of a communication channel.

When a baseband signal of a constant envelope QPSK signal is filtered into a filtered baseband input signal, the resultant modulated QPSK signal no longer has the constant-envelope property. If the filtered QPSK signal is then passed through a HPA operating at saturation, the spectral regrowth is present at the output of the HPA. Similarly, when two constant envelope signals are combined and then passed through a power amplifier operating at saturation, the properties related to spectral regrowth and IM products become uncertain. It has been shown that the spectral regrowth and power loss in the IM products can cause severe BER degradation. In order to reduce spectral regrowth and BER degradation associated with HPAs operating at saturation, an HPA linearizer is needed.

The amplitude and phase modulation distortions are minimized using linearization method. The linearization method minimizes the mean square error function between input and output. The linearization method requires modeling the characteristics of the amplitude distortion and phase distortion of the HPA. A Saleh model and a linear-log model have been used to provide the linearization method. The Saleh model has been applied to measured data from HPAs that characterize the distortion caused by the HPAs. The measured data provides a performance curve indicating nonlinear distortion. The measured data is curved fitted by selecting Saleh coefficients inserted into the Saleh model to then obtain a forward Saleh model that approximately fits the measured performance curve to a Saleh model curve. The forward Saleh model with the Saleh coefficients models the distortion of the HPA. The forward Saleh model is a math equation that describes the amplitude and phase modulation distortions of the HPA. The amount of desired predistortion is then determined to inversely match the amount of distortion for canceling out the distortion of the HPA. To determine the amount of predistortion, an inverse Saleh model is generated that mathematically describes the amount of predistortion necessary to inversely match the amount of distortion of the HPA. A mean square error function is defined by the difference between the forward Saleh model and inverse Saleh model and is used to compute the amount of predistortion adjustment needed. In order to compute the amount of predistortion needed, the inverse Saleh model is expanded into a power series. The power series is needed for reducing the mean square error function to improve the accuracy of the computed predistortion characteristics. The predistortion characteristics are then applied to an input signal to reduce amplitude and phase modulation distortions of an output signal relative to the input signal. However, the Saleh model method is not flexible enough to match a wide variety of HPA distortion characteristics. The Saleh model method requires high processing capabilities for power series expansion for minimizing the error of computed distortion by generating a power series for each particular HPA. As such, the Saleh model method does not offer a general solution for a wide class of HPAs. For different amplifiers having different distortion characteristics, the computations for predistortion using the Saleh model require substantial processing power.

The linear-log model also uses measurement data that characterizes the nonlinearity distortion of the HPA, and then stores predistorter characteristics in look-up tables that map the amount of predistortion to the input amplitude to reduce amplitude and phase modulation distortions. However, the linear-log model can not control clipping effects caused by operation of the HPA at or near saturation where desirable maximum input power is provided. To address this problem, the input is limited so as to avoid the saturation output operating point. As input signal amplitudes vary from signal to signal, and vary over time, and as HPA performance drifts over time, the linear-log model method requires adjusting the input signal amplitudes so as to avoid saturation clipping so as to maintain desired bit error rates. These and other disadvantages are solved or reduced using the invention.

SUMMARY OF THE INVENTION

An object of the invention is to provide linearization of the output of a high power amplifier using a predistorter.

Another object of the invention is to provide linearization of the output of a high power amplifier using a predistorter operating at baseband.

Another object of the invention is to provide linearization of the output of a high power amplifier using computed parameters that adjust the desired predistortion.

Another object of the invention is to provide linearization of the output of a high power amplifier using computed backoff parameters that changes the slope of a linearization curve of a predistorted HPA so that input signal can be processed at a normalized 0 dB.

Another object of the invention is to provide a linearization of means using a double set of Saleh extended coefficients to compute in closed-form the desired amount of predistortion.

Yet another object of the invention is to provide linearization of the output of a high power amplifier using an adjustable slope linearization for reducing unwanted amplitude modulation and phase modulation caused by amplitude variance of an input to the amplifier.

Another object of the invention is to reduce the occupied bandwidth of signal produced by an amplifier using baseband predistortion linearization.

Still a further object of the invention is to reduce bit signal to noise ratio degradation due to phase distortion of signal produced by an amplifier using baseband predistortion linearization.

Yet another object of the invention is to reduce spectral regrowth due to amplitude distortion and phase distortion by an amplifier using baseband predistortion linearization.

The present invention is directed to predistorters for the linearization of a high power amplifier (HPA) to mitigate the amplitude modulation to amplitude modulation distortion (AM-AM), that is, amplitude distortion, and amplitude modulation to phase modulation distortion (AM-PM), that is, phase distortion, and the distortion effects in communication systems, particularly digital communication systems. The linearization methods of the invention are advantageous to systems requiring improved HPA linearization performance. In a first aspect of the invention, an extended Saleh method is used, and in a second aspect of the invention, a modified linear-log model is used, both to reduce amplitude and phase distortions. Both methods can be implemented using an architecture having real to complex conversion prior to predistortion and complex to real conversion after predistortion. The predistortion is accomplished through complex processing operating at baseband as a complex baseband linearizer providing reduced spectral regrowth and simplicity in design.

The extended Saleh method invention offers a general solution including additional polynomial terms rendering an expression that is applicable to a wide class of HPAs, using a double set of extended Saleh coefficients without expanding the inverse Saleh model into the power series for any particular HPA, but enables the use of coefficients for particular HPAs entered into a general solution. The extended Saleh method offers improved flexibility to accommodate a wide class of HPA while operating at baseband. The desired predistortion can be computed in closed-form reducing processing power for the computation of the desired amount of predistortion. Whereas, the modified linear-log model reduces clipping when operating the HPA at saturation when the input is provided at a normalized 0 dB value. The modified linear-log method specifies the amount of acceptable loss of output power based on a normalized 0 dB input signal so that the input signal need not be controlled to avoid saturation. In the event of HPA drifts or varying input power level, voltage parameters can be computed and used to modify the slope of the linearization curve so as to avoid saturation and clipping. In this manner, the linear-log model method determines the linearization curve that minimizes clipping effects while maximizing the normalized output power level. The extended Saleh method and the modified linear-log method offer improved flexibility to accommodate operation at baseband with reduced system complexity of the transmitters. The extended Saleh and modified linear-log methods operating at baseband offer reduced spectral regrowth out of the communication bandwidth thereby reducing the occupied bandwidth for improved co-channel isolation. These and other advantages will become more apparent from the following detailed description of the preferred embodiment.

DETAILED DESCRIPTION OF THE PREFERRED EMBODIMENT

Figure 1:
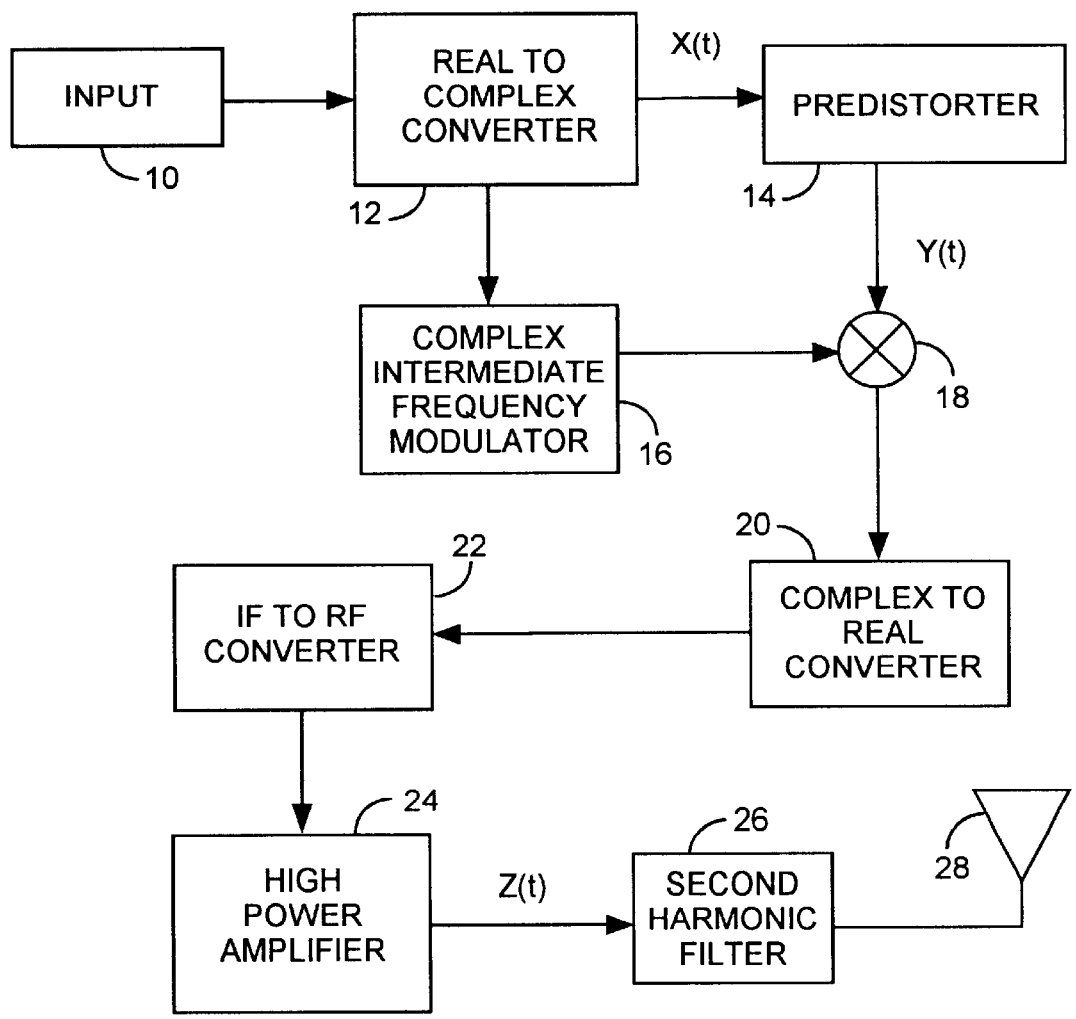
FIG. 1 is a block diagram of a baseband predistorter for linearizing the output of a high power amplifier.

An embodiment of the invention is described with reference to the Figures using reference designations as shown in the Figures. Referring to FIG. 1, an input signal 10 is converted into a complex input signal using a real to complex converter 12 providing a complex input signal at baseband. The complex input signal is fed into a predistorter 14 that may be based on either the extended Saleh model or the modified linear-log model. The complex input signal is also communicated to a complex intermediate frequency modulator 16 for up converting the complex input signal into an complex intermediate frequency signal at an intermediate frequency (IF). The predistorter 14 provides a predistorter signal that is mixed by a mixer 18 with the complex IF signal to provide a complex IF predistorted signal. The complex IF predistorter signal is communicated to a complex to real converter 20 that converts the complex IF predistorter signal into a real IF predistorted signal that is then communicated to an IF to radio frequency (RF) converter 22 for providing a predistorted RF signal that is, in turn, communicated to a high power amplifier (HPA) 24 providing a high power predistorted RF output signal. During conversion to IF and RF by converters 16 and 22 and by amplification by the HPA 24, undesirable second harmonics are generated and survive as component signals within the high power RF output signal. The RF output signal is fed into a second harmonic filter 26 for filtering out the second harmonic components to provide the output signal that is communicated to an antenna 28 for transmission.

This system implementation provides a baseband predistorter comprising the converter 12, the predistorter 14, complex IF modulator 16 and mixer 18. The predistorter 14 provides a predistortion linearization at baseband. The complex baseband predistorter receives the input signal 10 that may be for example an input signal into a ground-based transmitter. The RF predistorted output signal from the antenna 28 may be communicated up to a satellite transponder, not shown. The complex baseband linearizer serves to reduce by cancellation the amplitude modulation-to-amplitude modulation distortion (AM-AM), that is amplitude distortion, and amplitude modulation-to-phase modulation distortion (AM-PM), that is phase distortion, that are normally produced by the HPA 24.

Figure 2A:
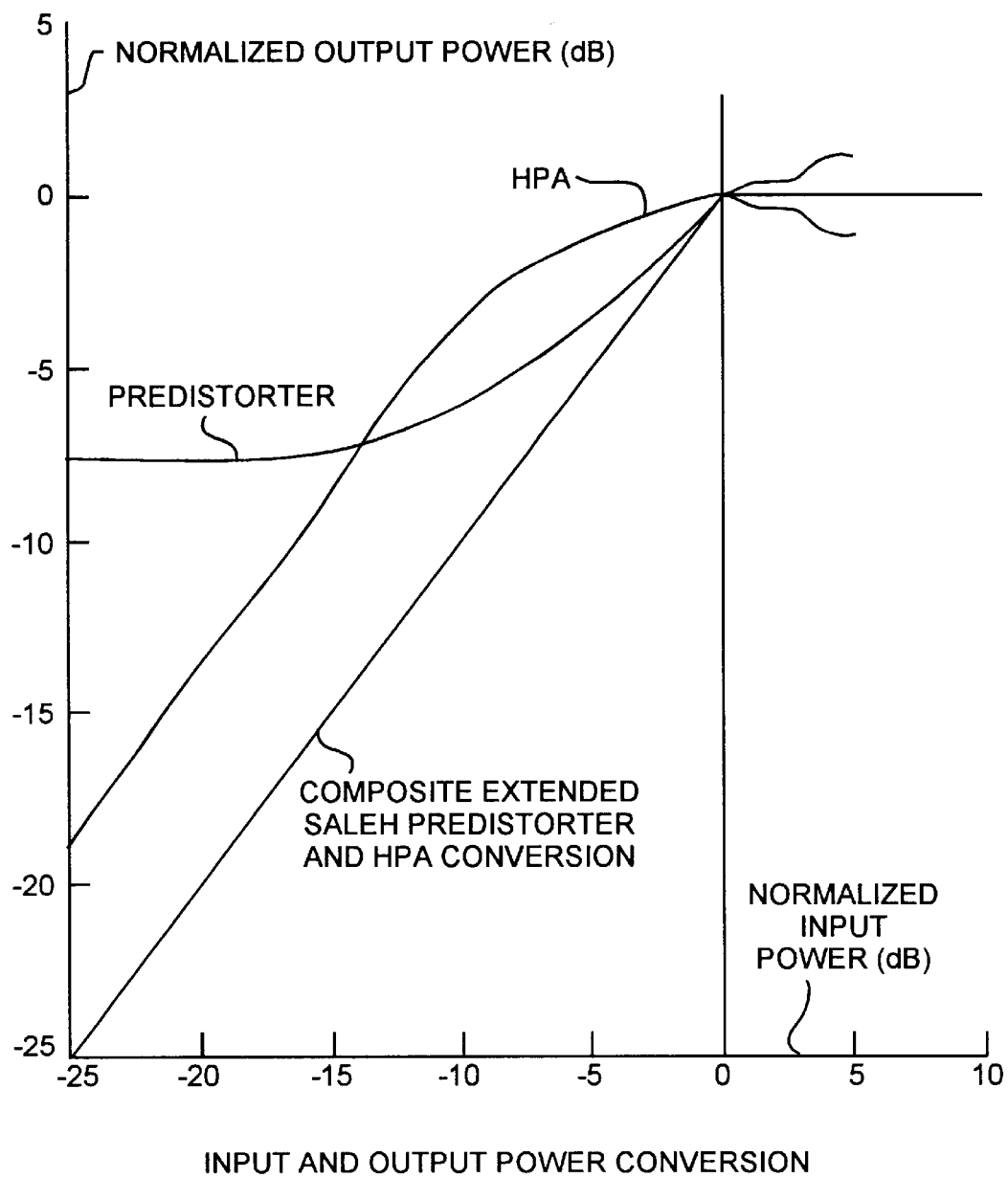
FIG. 2a is a graph of input and output power conversion of a high power amplifier using predistortion based on the extended Saleh model.
Figure 3A:
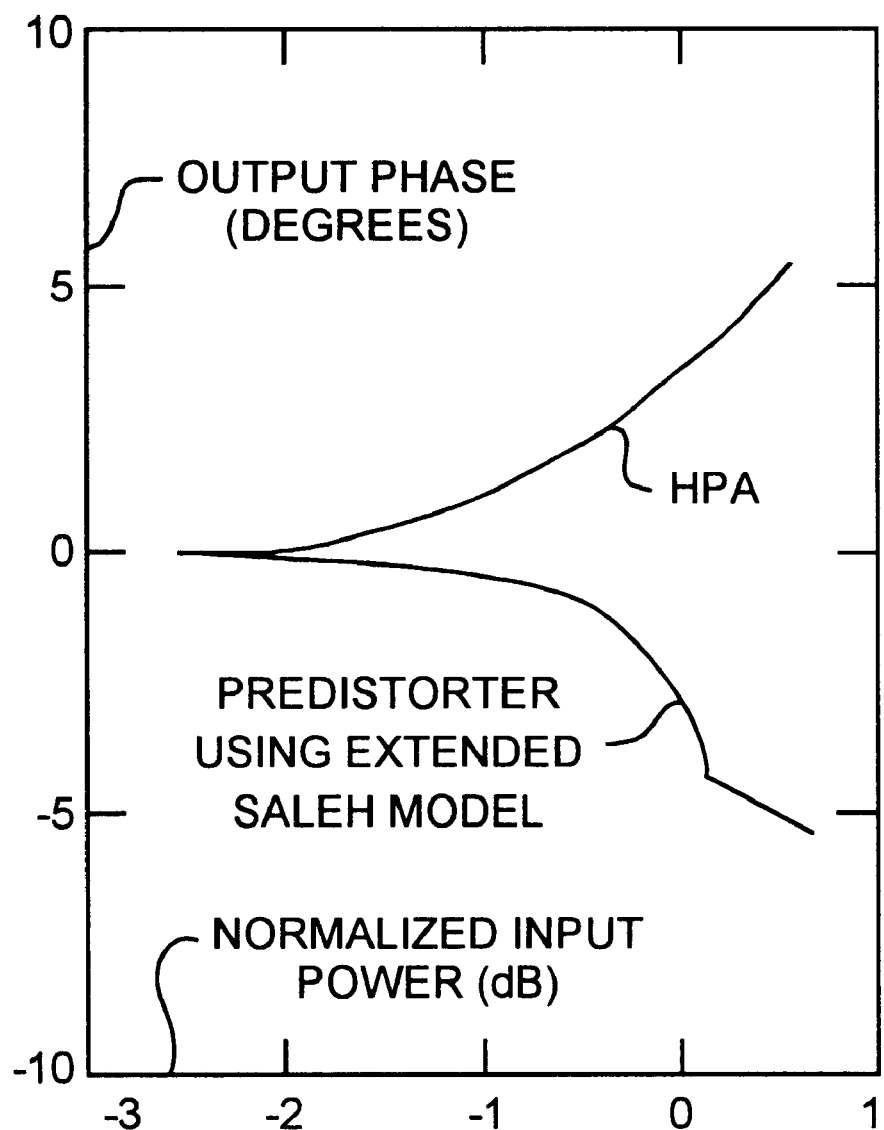
FIG. 3a is a graph of input power and output phase conversion of a high power amplifier using predistortion based on the extended Saleh model.
Figure 3B:
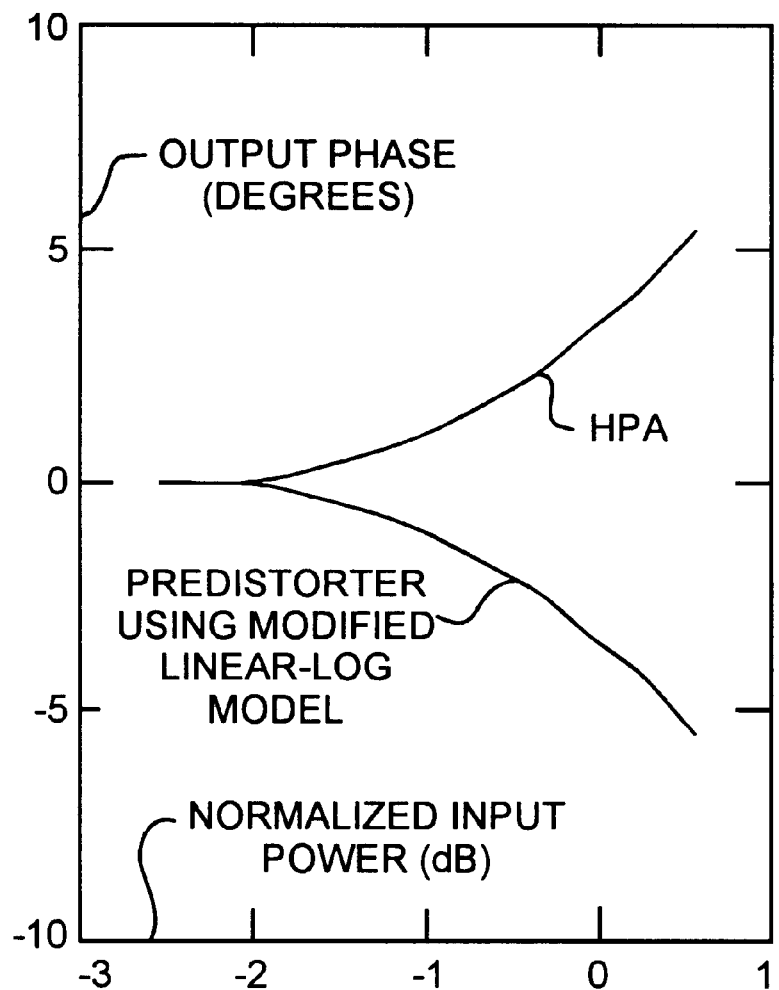
FIG. 3b is a graph of input power and output phase conversion of a high power amplifier using predistortion based on the modified linear-log model.

Referring to FIGS. 1 and 2a, and more particularly to FIG. 2a, when the extended Saleh model is used for predistortion, the predistortion effects of the predistorter 14 are combined with the distortion effects of the HPA 24 to provide a composite extended Saleh and HPA conversion response having a linearized curve of the normalized output power as a function of input power normalized to the peak input power operating point at 0 dB. Referring to FIGS. 1, 2a and 3a, and more particularly to FIG. 3a, when the extended Saleh model is used for predistortion, the HPA phase distortion is matched to the phase predistortion of the predistorter 14 so that the phase distortion of the output signal is reduced and constant over the operating input range of the input signal.

Figure 2B:
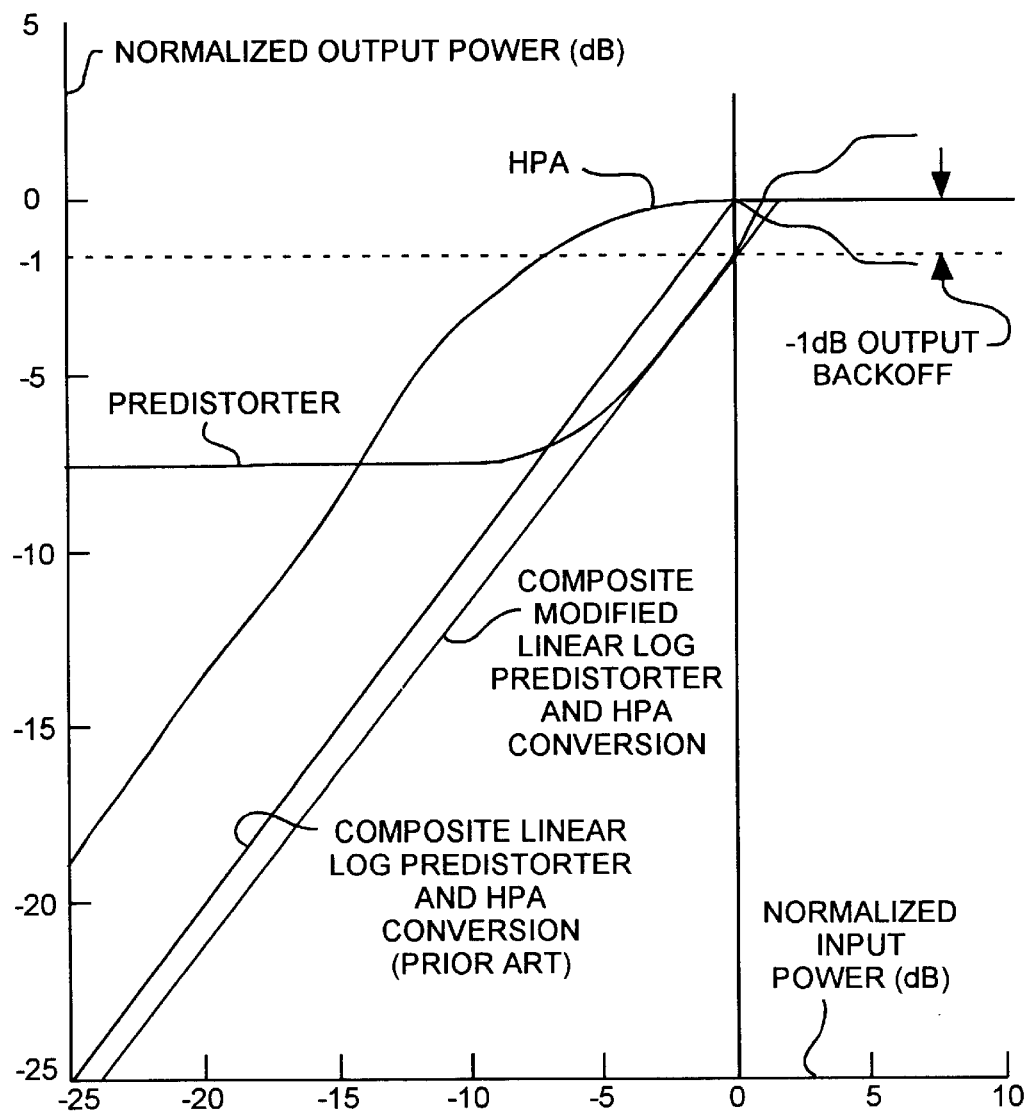
FIG. 2b is a graph of input and output power conversion of a high power amplifier using predistortion based on modified linear-log model.

Referring to FIGS. 1 and 2a, and more particularly to FIG. 3a, when the modified linear-log model is used for predistortion, the predistortion effects of the predistorter 14 are also combined with the distortion effects of the HPA 24 to provide a composite modified linear-log predistorter and HPA conversion response having a linearized curve of the normalized output power as a function of normalized input power that is backed off to a −1 dB normalized output power operating point at the normalized 0 dB input power point. The linear curve linearly extends through −1 dB output power point up to the 0 dB output power point. As shown, the composite linear-log predistorter and HPA conversion response reaches a peak at the 0 dB normalized output power operating point, and as such, tends to clip the output signal. The linearization of the composite modified linear-log predistorter and HPA conversion response with the −1 dB back off of the output power reduces clipping effects of the output signal at the 0 dB input power operating point. Referring to FIGS. 1, 2a and 2b, and more particularly to FIG. 2b, when the modified linear-log model is used for predistortion, the HPA phase distortion is also matched to the phase predistortion of the predistorter 14 so that the phase distortion of the output signal is reduced and constant over the operating input range of the input signal.

A data source, that is the source of the input signal 10, generates data bits that are converted into a complex data stream. The data source $\tilde{d}(t)$ is converted into a complex form $\tilde{d}^*(t)=d_I(t)-jd_Q(t)$. The real form is $RE\{\tilde{d}^*(t)\,e^{j\omega t}\}=d_Q(t)\cos(\omega t)+d_I(t)\sin(\omega t)$ at the intermediate frequency, where $\tilde{d}^*(t)e^{j\omega t}$ is the output of the complex modulator 16. The predistorter 14 block introduces an amplitude response as well as a phase shift to the data stream, which is then upconverted to an IF frequency through multiplication by a complex frequency term ($e^{j\omega t}$) at an $\omega$ angular frequency that is an $\omega_{IF}$ intermediate angular frequency. The output from mixer 18 at any instant of time can be expressed as in a complex predistorter equation.

Complex Predistorter Equation $$\tilde{d}(t)e^{j\omega_{IF}t}\rho_{PD}(t)e^{j\theta_{PD}(t)}$$

In the complex predistorter equation, $\tilde{d}(t)$ is the complex data stream or input signal 10, $\omega_{IF}$ is the IF angular frequency in radian per second, $\rho_{PD}(t)$ is the predistorter instantaneous amplitude response, and $\theta_{PD}(t)$ is the predistorter instantaneous phase response in degrees. As this predistorted signal passes through the HPA, the predistorted signal experiences the amplitude response and the phase shift of the HPA. The predistorter provides the generation of the predistortion amplitude response that is the inverse of the HPA amplitude response and the predistortion phase shift that is the negative of the HPA phase shift. In an ideal case, the output from the HPA would contain neither the amplitude responses nor the phase shifts of the predistorter and HPA, but a composite linearized response to the input signal.

Let X(t) be the input signal to the predistorter, Y(t) be the output of the predistorter and Z(t) be the output of the HPA amplifier. The complex baseband representations for these signals are expressed by complex equations.

Complex Equations $$X(t)=\rho_{x(t)}e^{j\theta_{x(t)}}$$

$$Y(t)=\rho_{y(t)}e^{j\theta_{y(t)}}$$

$$Z(t)=\rho_{z(t)}e^{j\theta_{z(t)}}$$

In the complex equations, $\theta_x(t)$, $\theta_y(t)$, $\theta_z(t)$, and $\rho_{x(t)}$, $\rho_{y(t)}$, $\rho_{z(t)}$ are the amplitudes and phases of the complex signals X(t), Y(t) and Z(t), respectively. When $M(\rho_{y(t)})$ and $\Phi(\rho_{y(t)})$ are the normalized AM-AM and AM-PM responses of the HPA due to the input signal Y(t), then the output Z(t) can be expressed as a function of $\rho$, $\theta$, and $\Phi$ in a composite complex output equation.

Composite Complex Output Equation $$Z(t)=M(\rho_{y(t)})e^{j(\theta_{y(t)}+\Phi(\rho_{y(t)}))}$$

The Saleh model for an HPA is extended into the amplitude and phase generalized equations.

Amplitude and Phase Generalized Equations $$M(\rho_{y(t)}) \equiv \rho_{z(t)} = \frac{\alpha_0 \rho_{y(t)}}{a_0 + (\beta_0(\rho_{y(t)} + b_0))^2}$$

$$\Phi(\rho_{y(t)}) = \frac{\alpha_1 \rho_{y(t)}^2}{a_1 + (\beta_1(\rho_{y(t)} + b_1))^2}$$

The unknown coefficients $a_0$, $a_1$, $b_0$, $b_1$, $\alpha_0$, $\alpha_1$, $\beta_0$ and $\beta_1$ are computed to give the best fit of the parameter dependency in the amplitude and phase generalized equations to the measured data. The measured data is simply the amplitude and phase response at various input power levels of the HPA, and is a well-know characterization technique for HPAs. Conventional parameter estimation methods and curve fitting algorithms may be used to determine the coefficients.

From the predistorter baseband equation y(t), $\exp(j\theta_{y(t)})$ can be expressed as $y(t)/\rho_y(t)$ to derive an output HPA equation.

Output HPA Equation $$Z(t) = \left[\frac{\alpha_0 Y(t)}{a_0 + (\beta_0(\rho_{y(t)} + b_0))^2}\right] e^{j\left[\frac{\alpha_1 \rho_{y(t)}^2}{a_1 + (\beta_1(\rho_{y(t)} + b_1))^2}\right]}$$

From the output HPA equation, it follows that the ideal predistorter output for a given input X(t), is expressed by a predistorter coefficient equation.

Predistorter Equation $$Y(t) = X(t)\left[\frac{a_0 + (\beta_0(\rho_{y(t)} + b_0))^2}{\alpha_0}\right]e^{-j\left[\frac{\alpha_1 \cdot \rho_{y(t)}^2}{a_1 + (\beta_1(\rho_{y(t)} + b_1))^2}\right]}$$

The predistorter function can be derived from the output HPA equation and the predistorter coefficient equation. Linearization is based on two methods for modeling the predistorter function. The first technique is based on the ideal predistorter equation as an extension of the Saleh model. The second model is based on the conventional linear-log model that can be extended into a modified linear-log model that can adjust the slope of the linearization curve.

For the extended Saleh model of the predistorter function, the amplitude and phase of the predistorter are derived directly from the predistorter equation, and through substitutions and equating, Saleh model amplitude and phase equations are derived.

Extended Saleh Model Amplitude and Phase Equations $$\rho_{y(t)} = \left[\frac{a_0 + (\beta_0(\rho_{y(t)} + b_0))^2}{\alpha_0}\right] \cdot \rho_{x(t)}$$

$$\theta_{y(t)} = \theta_{x(t)} - \left[\frac{\alpha_1 \cdot \rho_{y(t)}^2}{a_1 + (\beta_1(\rho_{y(t)} + b_1))^2}\right]$$

The AM-AM relationship of the extended Saleh model amplitude equation is usually expressed in terms of normalized input and output voltages or normalized input and output power. Solving for $\rho_{y(t)}$ from the extended Saleh model amplitude equation, and selecting only the negative sign for the square-root term in the numerator, a square-root predistorter equation is derived.

Square-Root Predistorter Equation $$\rho_{y(t)} = \frac{[\alpha_0 - 2b_0\beta_0\rho_{x(t)}] - \sqrt{\alpha_0^2 - 4\beta_0\rho_{x(t)} \cdot [a_0\rho_{x(t)} + b_0\alpha_0]}}{2\beta_0\rho_{x(t)}}$$

Because of the normalized input and output relationship, the negative sign is chosen to meet the dual conditions that the square root term is real and $0 \leq \rho_{y(t)} \leq 1$. With the amplitude and phase of the ideal predistorter function set to $\rho_{PD}$ and $\theta_{PD}$, respectively, then the output y(t) of the predistorter can be expressed by ideal predistorter output equations.

Ideal Predistorter Output Equations $$\rho_{PD} = \frac{\rho_{y(t)}}{\rho_{x(t)}} =$$

$$\begin{cases} \frac{[\alpha_0 - 2b_0\beta_0\rho_{x(t)}] - \sqrt{\alpha_0^2 - 4\beta_0\rho_{x(t)} \cdot [a_0\rho_{x(t)} + b_0\alpha_0]}}{2\beta_0\rho_{x(t)}}, & \rho_{x(t)} \leq 1 \\ 1, & \rho_{x(t)} > 1 \end{cases}$$

$$\theta_{PD} = -\left[\frac{\alpha_1 \cdot \rho_{y(t)}^2}{a_1 + \beta_1(\rho_{y(t)} + b_1)^2}\right]$$

The $\rho_{x(t)} > 1$ term indicates saturation of the HPA. Using curve-fitting parameters, the ideal predistorter output equations can be implemented in an AM-AM and AM-PM look-up table or closed-form AM-AM and AM-PM expressions using conventional techniques.

In the linear-log model, two sets of measured data are used for the HPA, namely, an AM-AM curve of normalized input power and normalized output power, both of which being expressed in dB, and the AM-PM curve of normalized input power and output phase, expressed in dB and degree, respectively. From these two curves, corresponding AM-AM and AM-PM curves are generated for the predistorter such that the combination of HPA function and predistortion results in X(t) and Z(t) being equal. The characteristics of the predistorter curves can be defined as $P_{PD}$(dB)=$P_{IN}$(dB)−$P_{outHPA}$(dB) with $\theta_{PD}$(degree)=−$\theta_{HPA}$(degree) where $P_{IN}$(dB) is the normalized input power to the AM-AM and AM-PM curves for both predistorter and the HPA, $P_{PD}$(dB) and $P_{outHPA}$(dB) are the normalized output power from the AM-AM curve for predistorter and HPA, and $\theta_{PD}$(degree) and $\theta_{HPA}$(degree) are the output phases from the AM-PM curves for predistorter and HPA. Using these curves, the complex signal Z(t) at the output of the HPA is identical to X(t). That is, the input amplitude is directly proportional to the output amplitude without phase distortion.

In the linear-log model, the composite AM-AM curve for the combination of predistorter and HPA is normalized such that the input power and output power are both 0 dB at saturation. In the modified linear-log model, the composite AM-AM curve has a slightly smaller slope below saturation. This results in the output power being less than 0 dB, and by a specified Δ dB, at the input power of 0 dB. That is, at the specified maximum normalized input power of 0 dB, the predistortion provides a loss of Δ dB at the HPA output. In this model, two sets of measured data are used including the AM-AM curve and AM-PM curve for the HPA. The characteristics of the predistorter curves can be defined as $P_{PD-MOD}$(dB)=Slope*$P_{IN}$(dB)−Δ(dB)−$P_{outHPA}$(dB), and $\theta_{PD-MOD}$(degree)=−$\theta_{HPA}$(degree), where Slope=[|$P_{inHPA-min}$(dB)|−|Δ(dB)|]/|$P_{inHPA-min}$(dB)|, and $P_{inHPA-min}$(dB) is the minimum normalized input power from the measured AM-AM curve for the HPA. The linear region ends at the input power of Δ(dB)/Slope. Therefore, $P_{PD-MOD}$(dB) equation is modified to be $P_{PD-MOD}$(dB)=−$P_{outHPA}$(dB) for $P_{IN}$(dB)>Δ(dB)/Slope. Using these characteristics, the complex signal Z(t) at the output of the HPA is very close to X(t), and the output power at the input saturation power of 0 dB is ΔdB less than the specified value. Hence, there is an introduced loss of ΔdB in the AM-AM curve to reduce the clipping of the output signal at saturation.

Computer simulation has been exercised to evaluate the performance of the linearizer using the extended Saleh model and the modified linear-log model to measure the power spectral density for occupied bandwidth and to measure the bit error rate (BER) performance with and without predistortion. The effects of the non linear HPA can be compensated for by using the linearizing predistorter at baseband using the extended Saleh model or the modified linear-log model. The extended Saleh model has slightly better out-of-band rejection performance than linear-log and modified linear-log models, but has a larger occupied bandwidth. The BER improvements for the extended Saleh model and the modified linear-log model are about 0.5 dB to 1.5 dB depending on the BER. The extended Saleh model has a closed-form solution, which requires much less memory than the look-up table approach without the need for interpolation. The closed-form solution using the extended list of parameters for the extended Saleh model allows the Saleh model to be more flexible toward new or changed HPA parameters. However, the look-up table approach for modified linear-log model is easier to derive from the HPA tables than the extended Saleh model. Because these linearizers are implemented at baseband, the linearizers offer lower cost and ease of implementation. The 0.5 dB to 1.5 dB of loss due to the HPA distortion is almost all gained back in improved performance. The inventions enable the use of a closed-form solution to predistortion and enable the use of differing sloped linearization curves to adapt to various input power levels at the maximum power output level but without clipping distortions. Using either model, processing power is reduced while adding flexibility to various HPA distortion responses and changing input power levels. Those skilled in the art can make enhancements, improvements, and modifications to the invention, and these enhancements, improvements, and modifications may nonetheless fall within the spirit and scope of the following claims.

What is claimed is:

1. A method of linearizing an output signal of an amplifier distorting an input signal, the output signal being derived from the input signal, the method comprising the steps of,
closed-form computing predistortion using an amplitude closed-form equation and a phase closed-form equation modeling distortion of the amplifier and using a set of predetermined coefficients of the closed-form equations for canceling distortion caused by the amplifier,
predistorting the input signal by the predistortion for providing a predistorted input signal, and
amplifying the predistorted input signal to generate the output signal, the output signal being linearized to the input signal.

2. The method of claim 1 wherein,
the input signal is an amplitude modulated input signal,
the distortion is amplitude distortion responsive to the amplitude modulation of the input signal, and
the output signal has an amplitude relative to an amplitude of the input signal, the output amplitude is linearized to the amplitude of the input signal during modulation of the amplitude modulated input signal.

3. The method of claim 1 wherein,
the input signal is an amplitude modulated input signal,
the distortion is phase distortion responsive to the amplitude modulation of the input signal, and
the output signal has an output phase relative to an input phase of the amplitude modulated input signal, the output phase is linearized to the input phase during modulation of the amplitude modulated input signal.

4. The method of claim 1 wherein the distortion is phase and amplitude distortion, the predistortion comprises phase and amplitude predistortion, and the closed-form computing step uses the phase and amplitude closed-form equations to compute the phase and amplitude predistortion, the method further comprising the steps of,
measuring amplitude and phase responses of the amplifier during modulation of the amplitude modulated input signal, and
selecting the predetermined coefficients so that the computed phase and amplitude predistortion inversely matches the amplitude and phase responses of the amplifier.

5. A method of linearizing an output signal of an amplifier distorting an input signal, the output signal being derived from the input signal, the method comprising the steps of, closed-form computing predistortion using a set of predetermined coefficients for canceling distortion caused by the amplifier,
predistorting the input signal by the predistortion for providing a predistorted input signal,
amplifying the predistorted input signal to generate the output signal, the output signal being linearized to the input signal, the distortion being phase and amplitude distortion, the predistortion comprising phase and amplitude predistortion, and the closed-form computing step using phase and amplitude closed-form equations to compute the phase and amplitude predistortions,
measuring amplitude and phase responses of the amplifier during modulation of the amplitude modulated input signal, and
selecting the predetermined coefficients so that the computed phase and amplitude predistortion inversely matches the amplitude and phase responses of the amplifier, wherein
the amplitude closed-form equation is:

$$M(\rho_{y(t)}) \equiv \rho_{z(t)} = \frac{\alpha_0 \rho_{y(t)}}{a_0 + (\beta_0(\rho_{y(t)} + b_0))^2};$$

the phase closed-form equation is:

$$\Phi(\rho_{y(t)}) = \frac{\alpha_1 \rho_{y(t)}^2}{a_1 + \beta_1(\rho_{y(t)} + b_1)^2}; \quad \text{and}$$

the predetermined coefficients are $a_0$, $a_1$, $b_0$, $b_1$, $\alpha_0$, $\alpha_1$, $\beta_0$ and $\beta_1$.

6. A method of linearizing an output signal of an amplifier distorting an input signal, the output signal being derived from the input signal, the method comprising the steps of,
closed-form computing predistortion using a set of predetermined coefficients for canceling distortion caused by the amplifier,
predistorting the input signal by the predistortion for providing a predistorted input signal,
amplifying the predistorted input signal to generate the output signal, the output signal being linearized to the input signal, the input signal being a baseband input signal,
converting the baseband input signal into a complex input signal,
predistorting the complex input signal to provide a predistorted complex signal at baseband,
up converting the complex input signal into an intermediate frequency complex signal by modulation with an intermediate frequency,
mixing the predistorted complex signal with the intermediate frequency complex signal to provide a mixed predistorted signal, and
up converting the mixed predistorted signal into the predistorted input signal by mixing the mixed predistorter signal with a radio frequency.

* * * * *